United States Patent [19]

Dingwall

[11] 4,206,418
[45] Jun. 3, 1980

[54] CIRCUIT FOR LIMITING VOLTAGE DIFFERENTIAL IN DIFFERENTIAL AMPLIFIERS

[75] Inventor: Andrew G. F. Dingwall, Bridgewater, N.J.

[73] Assignee: RCA Corporation, New York, N.Y.

[21] Appl. No.: 921,207

[22] Filed: Jul. 3, 1978

[51] Int. Cl.[2] .............................................. H03F 3/45
[52] U.S. Cl. ................................................... 330/253
[58] Field of Search ........................ 330/253, 277, 288

[56] References Cited

U.S. PATENT DOCUMENTS

| | | | |
|---|---|---|---|
| 3,870,968 | 3/1975 | Vosteen et al. | 330/207 P |
| 3,947,727 | 3/1976 | Stewart | 330/277 X |
| 4,044,313 | 8/1977 | Wittlinger et al. | 330/207 P |
| 4,126,830 | 11/1978 | Schade, Jr. | 330/298 |

*Primary Examiner*—James B. Mullins
*Attorney, Agent, or Firm*—H. Christoffersen; H. I. Schanzer

[57] ABSTRACT

The circuit includes means for limiting the potential difference that can exist between corresponding electrodes of two input transistors interconnected to form a differential amplifier stage. The control electrode of each input transistor is coupled via a normally conducting gating transistor to its respective input terminal and via a normally non-conducting clamping transistor to a common point to which is connected one end (source or emitter) of the main conduction paths of the two input transistors. In response to an input signal at an input terminal having a polarity and a first value to turn off an input transistor, the gating transistor is turned off and decouples the control electrode of the input transistor from its corresponding input terminal. Then, as the input signal increases beyond the first value in a direction to further reverse bias the input transistor, the clamping transistor is turned on and clamps the control electrode of the input transistor to the common point. The circuit may also include means connected to the output (drain or collector) electrodes of the two input transistor to prevent excessive voltage differentials between their output electrodes.

10 Claims, 3 Drawing Figures

CIRCUIT FOR LIMITING VOLTAGE DIFFERENTIAL IN DIFFERENTIAL AMPLIFIERS

This invention relates to means for maintaining the difference in the potentials at corresponding electrodes of transistors interconnected to form a differential amplifier within given limits, without loading or disturbing external signal sources providing signals to the amplifier.

When the input electrodes (gate or bases) of a pair of transistors interconnected to form a differential amplifier (DIFF-AMP) stage are operated at different potentials, for an extended period of time, the amplifier is subject to "offset drift". The "offset" of a differential amplifier refers to the presence of a differential output signal although the differential input signal is zero, and "offset drift" refers to a change in the offset. The magnitude of the offset drift is a function of the magnitude of the differential input voltage. As long as both inputs of a DIFF-AMP are held at the same potential, drifts in one transistor of the DIFF-AMP are effectively compensated by corresponding changes in the other transistor of the DIFF-AMP. Thus, relatively little, if any, offset drift is noted for small differences in the input voltage. Tests have shown that the offset drift increases exponentially as a function of the differential input and that as the input voltage imbalance exceeds 4 or 5 volts substantial offset drift occurs.

A solution to the problem of offset drift is to "clamp" the control electrodes of the input differential transistors so that the maximum differential stress than can be developed across their control electrodes is limited to a fixed amount. For example, it is known in the art to use back-to-back diodes across the gate electrodes of two differentially connected MOS transistors to limit the potential differential between the gate electrodes of the transistors to the one $V_{BE}$ drop of the two diodes. The small voltage difference (the $V_{BE}$ drop) permitted between the gates of the two input transistors prevents the development of significant offset drift.

However, the simple back-to-back diodes clamping scheme suffers from a serious disadvantage rendering the scheme impractical for many applications. When one of the input signals exceeds the other input signal by more than $V_{BE}$ volts, clamping occurs. The two input lines are then loaded with the input signal source of one line coupled via a low impedance to the input signal source connected to the other line. The advantageous high-input impedance feature of the MOS amplifier is then compromised. This drawback is overcome in circuits embodying the invention which include means for clamping the control electrodes of the input transistors internally without disturbing or loading the external circuitry.

In circuits embodying the invention, the control electrode of a first transistor, interconnected with a second transistor to form a differential amplifier input stage, is coupled via a normally conducting gating transistor to an input terminal and via a normally nonconducting clamping transistor to a point common to one end of the main conduction paths of the first and second transistors. The gating transistor is turned off prior to the turn on of the clamping transistor whereby the voltage stress across the first and second transistors is limited without loading or disturbing a signal source coupled to the input terminal.

Figure 1:
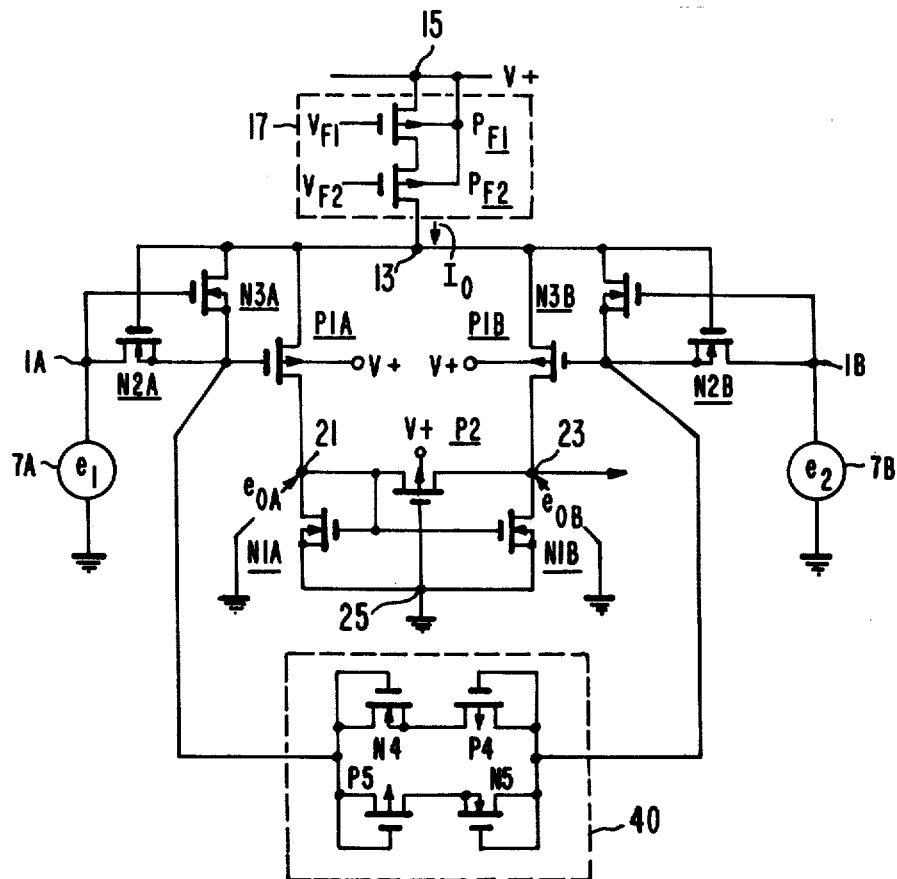
FIG. 1 is a schematic diagram of a circuit embodying the invention.
Figure 3:
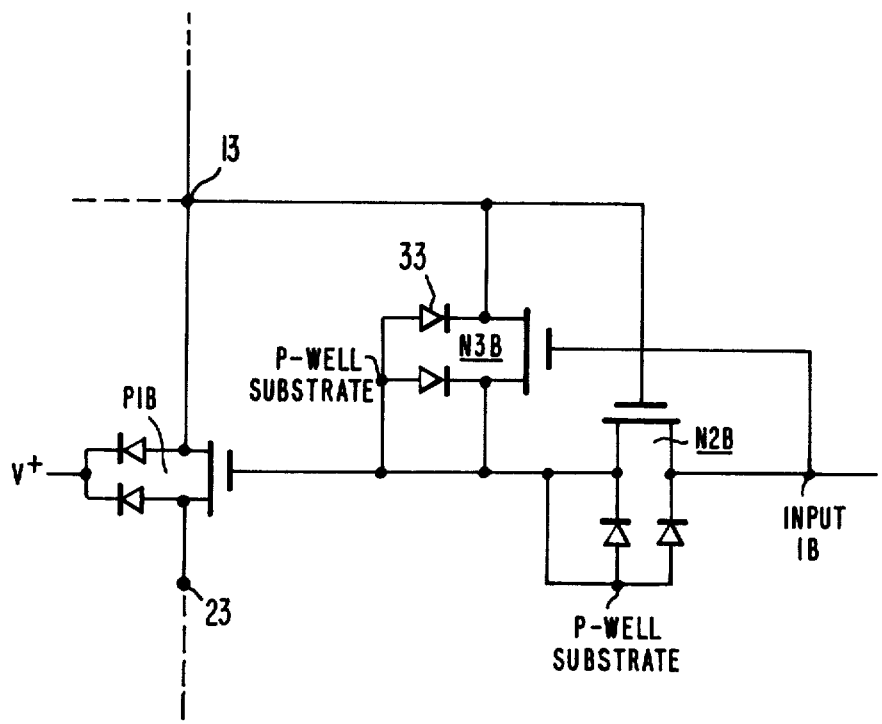
FIG. 3 is a schematic diagram of internal clamping circuitry inherent to the circuit of FIG. 1.

The active devices which are preferred for use in practicing the invention are insulated-gate field-effect transistors (IGFETs) of the enhancement type formed in bulk silicon. For this reason, the circuits of FIGS. 1 and 3 are illustrated as employing such transistors and will be so described hereinafter. However, this is not intended to preclude the use of other suitable devices such as bipolar transistors, depletion type field-effect transistors of insulated-gate or junction-gate type, or transistors formed on an insulator substrate. To this end, the term "transistor", when used without limitation in the appended claims, is used in a generic sense.

The transistors of P-conductivity type are formed in an N-substrate. They are identified by the letter P and a reference numeral, and are shown in the drawings with an arrow on their substrate connection pointing away from the body of the transistor. The transistors of N conductivity are formed in P-wells diffused in the N substrate. They are identified by the letter N and a reference numeral, and are shown in the drawings with an arrow on their substrate connection pointing towards the body of the transistor.

Transistor characteristics are well known and need not be described in detail. But, for a clearer understanding of the description to follow, the following definitions and characteristics pertinent to the invention are set forth:

1. The IGFETs used have a first electrode and a second electrode which define the ends of a conduction path and a control electrode (gate) whose applied potential determines the conductivity of the conduction path. The first and second electrodes of an IGFET are referred to as the source and drain electrodes. For a P-type IGFET the source electrode is defined as the one of the first and second electrodes having the higher potential applied thereto. For an N-type IGFET, the source electrode is defined as the one of the first and second electrodes having the lower potential applied thereto.

2. For conduction to occur, the applied gate-to-source potential ($V_{GS}$) must be in a direction to forward bias the gate with respect to the source and must be greater in magnitude than a given value which is defined as the threshold voltage ($V_T$) of the transistor. Thus, where the applied $V_{GS}$ is in a direction to enhance conduction but is lower in amplitude than $V_T$, the transistor remains cut off and there is substantially no current flow in the conduction channel.

3. The IGFETs used are bidirectional in the sense that, when an enabling signal is applied to the control electrode, current can flow in either direction in the conduction path defined by the first and second electrodes.

FIG. 1 shows the input stage of a differential amplifier comprised of P-channel IGFETs P1A and P1B whose source electrodes are connected to a common source line 13. The gate-to-source voltage of P1A is limited by a gating IGFET N2A and a clamping IGFET N3A. The conduction path of N2A is connected between the gate of P1A and an input terminal 1A, and the conduction path of N3A is connected between the gate and source electrodes of P1A. The gate of N2A is connected to source line 13 and the gate of N3A is connected to input 1A. Similarly, the gate-to-source voltage of P2A is limited by a network which includes a gating IGFET N2B and a clamping IGFET N3B. One end of the conduction paths of N2B and N3B are connected to the gate of P1A, the other end of the conduction path of N2B and the gate of N3B are connected to an input terminal 1B, and the gate of N2B and the source of N3B are connected to line 13. An input signal source 7A applies an input signal $e_1$ to input terminal 1A and an input signal source 7B applies an input signal $e_2$ to input terminal 1B.

A relatively constant current source 17 is connected between line 13 and a power terminal 15 to which is applied a positive operating potential of V+ volts. Current source 17, for example, includes IGFETs $P_{F1}$ and $P_{F2}$ having their conduction paths connected in series between nodes 13 and 15. Fixed potentials $V_{F1}$ and $V_{F2}$ are, respectively, applied to the gate electrodes of transistors $P_{F1}$ and $P_{F2}$, which then function to pass a relatively constant current, $I_O$, between nodes 15 and 13.

The differential output signals generated at the drains of P1A and P1B are converted into a single ended output by means of IGFETs N1A and N1B which are interconnected to form a current mirror. The gate and drain of N1A and the gate of N1B are connected to the drain of P1A at node 21. The drain of N1B is connected to the drain of P1B at node 23, and the source electrodes of N1A and N1B are connected to node 25 to which is applied ground potential.

The conduction path of an IGFET P2 is connected between nodes 21 and 23 and its gate is returned to ground potential. P2 functions to limit the positive going voltage swing at the drains of P1A, N1A, P1B and N1B to approximately $V_{TP}$ volts above ground potential, where $V_{TP}$ is the threshold voltage of P2.

The explanation of the operation of the circuit of FIG. 1 to follow may best be understood by first noting the following:

1. The "actual" threshold voltage ($V_T$) of an IGFET is defined as the minimum $V_{GS}$ needed to turn on the IGFET, for the source and substrate at the same potential and at a very small drain-source current ($I_{DS}$). When a reverse bias is applied between the source and substrate of an IGFET, a greater $V_{GS}$ than the "actual" $V_T$ is necessary to turn it on. This greater $V_{GS}$ may be defined as the "effective" $V_T$ of the IGFET.

In the circuit of FIG. 1, the N-type IGFETs have their sources connected to their substrates and hence have zero source-to-substrate bias voltages. The substrates of P-type transistors P1A, P1B and P2 are connected to terminal 15 which is at V+, while their source electrodes are at a lower potential. Hence, there is a substantial reverse bias between their sources and substrates which increases their effective threshold voltages. Consequently, in the discussion to follow it is assumed that the "effective" threshold voltage ($V_{TP}$) of P type IGFETs P1A, P1B and P2 is of greater magnitude than the "actual" threshold voltage ($V_{TN}$) of the N type IGFETs (e.g. $V_{TP} \geq V_{TN}$).

2. The $V_{GS}$ of a transistor conducting some current $I_{DS}$ may be as expressed as the sum of the threshold voltage of the transistor and a $\Delta V$ due to the $I_{DS}$. $\Delta V$ varies as a function of the $I_{DS}$ level. For example, $\Delta V$ of P1A for $I_{DS} = I_O/2$ may be 0.3 volts which is significantly less than the $\Delta V$ of P1A for $I_{DS} = I_O$ which may be 0.5 volts. However, for ease of explanation, it is assumed in the following discussion that $\Delta V$ is relatively constant over the operating range of each transistor.

3. For values of $e_1$ equal to $e_2$ lying between zero volts and $(V+-V_{TP})$ volts; i.e., $0 \leq e_1 = e_2 \leq V+-V_{TP}$):

a. $I_{DS}$ of P1A is assumed equal to $I_{DS}$ of P1B, each being assumed equal to $I_O/2$.

b. The voltage on line 13 ($V_{13}$) is equal to $e_1$ (or $e_2$) + $V_{TP} + \Delta V$; where $\Delta V$ is the incremental increase in the $V_{GS}$ of P1A or P1B due to $I_{DS}$ through P1A or P1B.

c. The gating transistors N2A, N2B are conducting (turned-on) and clamping transistors N3A, N3B are nonconducting (turned-off). N2A and N2B are conducting since their $V_{GS}$ is equal to the sum of $V_{TP} + \Delta V$ which is greater than their $V_{TN}$. N3A and N3B are turned off since their $V_{GS}$'s are each equal to, or close to, zero volts which is less than their $V_{TN}$.

4. For $e_1$ not equal to $e_2$, $V_{13}$ is equal to the less positive of the input signals ($e_1$ or $e_2$) plus the $V_{TP}$ and $\Delta V$ of the input transistor to whose gate the less positive input signal is applied.

In the discussion of the operation to follow, assume that $e_1$ remains fixed at some value $V_A$ and that $e_2$ goes positive with respect to $V_A$. Since $e_1$ remains at $V_A$, $V_{13}$ will be at $V_A$ plus the $V_{TP}$ and $\Delta V$ of P1A. As $e_2$ goes positive relative to $V_A$, P1A conducts more and P1B conducts less. The $\Delta V$ of P1A increases slightly due to the additional $I_{DS}$ through P1A, while the $V_{GS}$ of P1B and N2B decrease. (But, as per paragraph number 2 above the increase in $\Delta V$ is ignored). As $e_2$ goes positive and the $V_{GS}$ of P1B becomes equal to or less than its $V_{TP}$, P1B turns off. For P1B to turn off the potential ($V_{GB}$) at the gate of P1B must be $\Delta V$ volts more than the potential ($V_{GA}$) at the gate of P1A. Thus, P1B turns off when $e_2 - e_1 = \Delta V$ and $V_{GB} - V_{GA} = \Delta V$. For this condition the $V_{GS}$ of P1A is $V_{TP} + \Delta V$ while the $V_{GS}$ of P1B is $V_{TP}$.

As $e_2$ goes more positive than $V_A$ the potentials at the drain and source of N2B become more positive while its gate voltage ($V_{13}$) remains essentially fixed. Thus, N2B is being rendered less conducting. N2B remains conducting until its $V_{GS}$ becomes equal to or less than its $V_{TN}$. Transistor N2B turns off when $e_2 = -V_A + \Delta V + V_{TP} - V_{TN}$ or, more generally, when $e_2 - e_1 = \Delta V + V_{TP} - V_{TN}$. The gate to source stress of P1A (which is ON) is then equal to $V_{TP} + \Delta V$ while the gate to source stress of P1B (which is OFF) is $\Delta V + V_{TP} - V_{TN}$. As soon as N2B cuts off, input terminal 1B is effectively isolated from the gate of P1B and signal source 7B is not loaded or disturbed by the amplifier circuit. Transistors P1B and N2B remain non-conducting for values of $e_2 - e_1$ more positive than $\Delta V + V_{TP} - V_{TN}$ and transistor N3B is nonconducting until $e_2 - e_1$ becomes more positive than $\Delta V + V_{TP} + V_{TN}$. (It will be shown below that, although the gate of P1B is electrically floating after N2B cuts off and before N3B turns ON, its positive going voltage excursions are limited by the source-to-substrate and drain-to-substrate diodes of transistor N3B).

As soon as $e_2$ is $V_{TN}$ volts more positive than $V_{13}$, ($e_2 - e_1$ is then equal to or greater than $\Delta V + V_{TP} + V_{TN}$) N3B is turned on and clamps the gate of P1B to source line 13 via its conduction path which now functions as a relatively low impedance path. For this signal condition, the $V_{GS}$ of P1A is still $V_{TP} + \Delta V$, while the $V_{GS}$ of P1B is approximately zero and $V_{GB} - V_{GA}$ is then $V_{TP} + \Delta V$. Of course, P1B and N2B remain turned off with signal source 7B decoupled from the gate of P1B.

Figure 2:
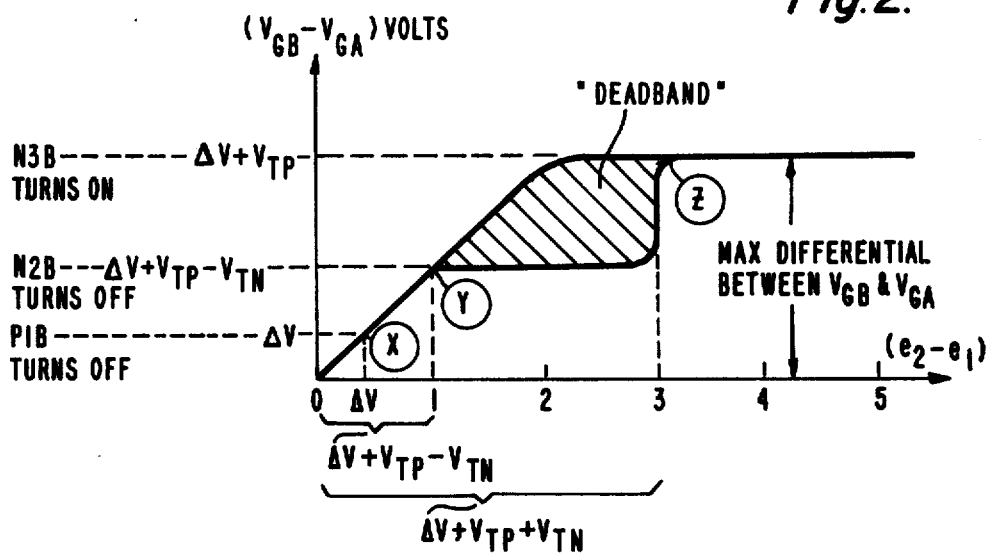
FIG. 2 is a waveform diagram showing the maximum voltage differential that can exist between the gate electrodes of the amplifier input stage of FIG. 1.

To better illustrate the above discussion, the change in the voltage difference ($V_{GB}-V_{GA}$) between the gates of P1A and P1B for increasing $e_2$ relative to $e_1$ is shown in FIG. 2. It is assumed, by way of example, that $\Delta V$ is 0.4 volt, $V_{TP}$ is 1.6 volt and $V_{TN}$ is 1.0 volt. As shown in FIG. 2 and as discussed above, for $e_2-e_1$ increasing in a positive direction, P1B turns off when $e_2-e_1$ and $V_{GB}-V_{GA}$ are equal to $\Delta V$ volts (graphically shown at point Ⓧ. N2B turns off when $e_2-e_1$ and $V_{GB}-V_{GA}$ are equal to $\Delta V + V_{TP} - V_{TN}$ (graphically shown at point Ⓨ. After N2B is turned off and before N3B is turned on the gate of P1B is electrically floating.

For the condition $\Delta V + V_{TP} - V_{TN} \leq e_2 - e_1 \leq \Delta V + V_{TP} + V_{TN}$ as shown graphically between points Ⓨ and Ⓩ there is a "dead band" during which transistor N2B, P1B and N3B are turned off. Although the gate of transistor P1B is electrically floating it is in a definitely "OFF" state and its voltage swing is limited. Referring to FIG. 3 which details the source and drain to substrate diodes of transistors P1B, N2B and N3B, it is evident that as soon as $V_{GB}$ tries to rise by more than $V_{BE}$ volts (typically approximately 0.7 volt) above $V_{13}$ that one of the source/drain-to-substrate diodes (e.g. 33) of transistor N3B conducts in the forward direction and clamps $V_{GB}$ to $V_{13} + V_{BE}$.

To ensure absolute disconnection of the signal source applied to an input terminal, one can provide for a small "dead band" in which the gate electrode of the input transistor is partially floating (i.e. it can assume a potential which is indeterminate within a small range). This is, however, without significance to the amplifier since the range of indeterminate voltages are all within the OFF range of the turned off transistor (P1B).

As soon as $e_2-e_1$ exceeds $\Delta V + V_{TP} + V_{TN}$, as shown graphically at point Ⓩ, the gate of P1B remains clamped to $\Delta V + V_{TP}$ which for the values assumed above is approximately 2.0 volts. Clamping to the common source line preceded by a "dead band" is automatically guaranteed. N3B cannot turn on until one threshold voltage, $V_{TN}$, is developed across N2B. This can only happen if the source of N2B (i.e. the inactive gate P1B) does not follow the input signal (i.e. is disconnected from node 1B).

Note that the gating transistor N2B is turned off prior to clamping transistor N3B being turned on. Consequently, when N3B turns on the signal source applied to terminal 1B is isolated from the gate of P1B. Transistor N3B clamps the source line 13 to the gate of P1B. But, since the gate of P1B presents an extremely high impedance to the line there is no loading of the power supply 15 and of the constant current generator 17. Furthermore, the signal source applied to terminal 1A is coupled to the gate of P1A via the conduction path of N2A, but it remains isolated from line 13 due to the high impedances of the gate-to-source of P1A and of the non-conducting N3A. Hence, neither input signal source 7A nor 7B is loaded by the voltage limiting circuit although the voltage excursions are limited.

The maximum potential difference between the gates of P1A and P1B is limited to $\Delta V + V_{TP}$ which also determines the maximum amount by which the $V_{GS}$ of P1A can differ from the $V_{GS}$ of P1B. Hence, throughout the range of operation the two transistors are subjected to similar gate and gate-to-source potential stresses.

Significant features of, and functions performed by, the circuit are: (1) any interaction between input signal sources (7A, 7B) applied to the input terminals (1A, 1B) of the circuit is avoided since there is no conductive clamping path between the input terminals. (2) Normal amplifier action takes place when both of the differential inputs ($e_2$, $e_1$) are within $\Delta V$ volts of each other. (3) A gating transistor (e.g. N2B) is turned off only after its associated input transistor (e.g. P1B) has already been turned off. Actually, the gating transistor is turned off only after a certain margin (from Ⓧ to Ⓨ in FIG. 3) is exceeded.

The input transistor is totally off when "disconnection" occurs by the turning off of the gating transistor. Hence, the input signal sources are decoupled from the input transistor only after the input transistors are no longer responsive to the input signals supplied by the sources and amplifier performance is clearly not affected. (4) The gate electrode of the turned off input transistor is clamped to the common source line (or bus) of the differential stage. This is a convenient voltage point which tracks the active gate by a fixed amount, e.g., about 2 volts. Clamping must only occur when the gate is absolutely disconnected so no fault current can flow. This is achieved by providing a "dead band" as described above.

The voltage swings at the drains of P1A and P1B is now examined. As stated above, for $e_1=e_2$, $I_{DSA}$ (the $I_{DS}$ and P1A) is equal to $I_{DSB}$ (the $I_{DS}$ of P1B). When $e_2$ goes positive with respect to $e_1$, $I_{DSA}$ increases, while $I_{DSB}$ decreases, and the voltage, $e_{OB}$, at node 23 goes towards ground as more current is sunk by N1B then is supplied by P1B. Conversely, as $e_2$ goes negative with respect to $e_1$, $e_{OB}$ goes towards V+ volts as less current is sunk by N1B then is supplied by P1B.

In the absence of transistor P2 it is possible for the voltage $e_{OB}$ at node 23 to swing between 0 volts, and close to V+ volts. That is, for $e_1$ greater than $e_2$ (P1B fully turned off, P1A fully turned on), $e_{OB}$ rises to within a volt or two of V+ volts, and for $e_1$ less than $e_2$ the $e_{OB}$ is driven towards zero volts. The voltage $e_{OA}$ at node 21 (the drains of P1A and N1A) is normally limited to the $V_{TN}$ of N1A + $\Delta V$ so long as P1A is conducting. But, if and when P1A cuts off ($e_1 \geq e_2 + \Delta V$), node 21 floats and $e_{OA}$ is indeterminate. As connected, transistor P2 conducts bidirectionally, and limits the voltage swings at nodes 21 and 23 to $V_{TP}$ volts above ground potential. As $e_{OB}$ rises above $V_{TP}$ of P2, P2 conducts conventional current from the drain of P1B into the drain of N1A raises the gate voltage of N1A and N1B increasing their conductivity. P2 then acts to maintain $e_{OB}$ at or below the $V_{TP}$ of P2 and to maintain $e_{OA}$ between $V_{TN}$ and $V_{TP}$. Similarly, if $e_{OA}$ rises above $V_{TP}$, P2 conducts conventional current from the drain of P1A into the drain of N1B and output node 23. The source-to-drain impedance of P2 is then low and it tends to hold $e_{OA}$ close to $e_{OB}$.

Thus, in FIG. 1 the sources of P1A and P1B are at the same voltage, their gate voltage may differ by a maximum of $V_{TP} + \Delta V$ and their drain voltage may differ by approximately $V_{TP}$ volts. Hence, input transistors P1A and P1B undergo similar voltage stresses throughout the range of operating potential. Consequently, in circuits according to the invention, offset drift due to imbalanced voltage conditions is reduced considerably.

In the discussion above it has been assumed that $e_2$ increased while $e_1$ remained fixed. However, it should be evident that the analysis applies identically for the condition of $e_2$ increasing relative to $e_1$, even if $e_2$ remains fixed and $e_1$ is decreasing, or both are changing at the same time. Furthermore, it should be evident that the input circuit is symmetrical and that $e_1$ can increase with respect to $e_2$ in which case the "A" side of the amplifier stage would undergo the changes described above for the "B" side.

FIG. 1 also includes an optional MOS diode clamping arrangement 40 connected between the gates of P1A and P1B. The MOS diodes may be used to narrow the "dead band".

The arrangement includes a first unidirectional conduction path comprised of IGFETs N4 and P4 having their conduction paths connected in series for conducting current from the gate of P1A to the gate of P1B and a second unidirectional conduction path comprised of IGFETs N5 and P5 having their conduction paths connected in series for conducting current from the gate of P1B to the gate of P1A.

IGFETs N4, P4, N5 and P5 with their gates connected to their respective drains function as MOS diodes, the P type diodes having a drain-to-source drop approximately equal to the $V_{TP}$ of the transistor and the N type diodes having a drain-to-source drop approximately equal to the $V_{TN}$ of the transistor. The maximum gate voltage difference between P1A and P1B would then be limited to $V_{TP}+V_{TN}$.

In the discussion of the circuit of FIG. 1 it was assumed that the active devices were IGFETs formed in bulk silicon. It should be appreciated, however, that the active devices could also be IGFETs formed on an insulator substrate such as sapphire. Applicant, in fact, made such a circuit and made circuit connections to the substrate of the transistors as shown in FIG. 1; the substrate for such devices being defined as the region between the source and drain underlying the channel or conduction region.

What is claimed is:
1. The combination comprising:
   first and second input terminals for the application of differential signals therebetween;
   first and second transistors each transistor having first and second electrodes defining the ends of a conduction path and having a control electrode;
   means connecting said first and second transistors in a differential amplifier configuration including means connecting the first electrodes of said first and second transistors to a common point;
   a first means, connected between said first input terminal and the control electrode of said first transistor, responsive to the potential differential between said common point and said first input terminal for:
   (a) providing a conduction path between said input terminal and said control electrode of said first transistor when said potential differential is greater than a first value and is of a polarity to turn-on said first transistor, and
   (b) decoupling the control electrode of said first transistor from said first input terminal in response to said potential differential having a second value and a polarity to turn off said first transistor;
   a second means connected between the control electrode of said first transistor and said common point responsive to said potential differential for clamping said control electrode of said first transistor to said common point via a low impedance path in response to said potential differential having a greater magnitude than said second value in a direction to turn off said first transistor; and
   means coupling the control electrode of said second transistor to said second input terminal.

2. The combination as claimed in claim 1 wherein said first means is comprised of a third transistor having its conduction path connected between said first input terminal and the control electrode of said first transistor, and having its control electrode connected to said common point; and
   wherein said second means is comprised of a fourth transistor having its conduction path connected between said control electrode of said first transistor and said common point, and having its control electrode connected to said first input terminal.

3. The combination as claimed in claim 2 wherein said means coupling the control electrode of said second transistor to said second input terminal includes a fifth transistor having its conduction path connected between said second input terminal and the control electrode of said second transistor, and having its control electrode connected to said common point; and
   further including a sixth transistor having its conduction path connected between said control electrode of said second transistor and said common point, and having its control electrode connected to said second input terminal.

4. The combination as claimed in claim 3 wherein each one of said first and second transistors is an insulated-gate field-effect transistor (IGFET),
   wherein said first electrode is a source electrode and said second electrode is a drain electrode; and
   wherein said means connecting said first and second transistors in a differential amplifier configuration includes means for generating a relatively constant current connected between a first point of operation potential and said common point.

5. The combination as claimed in claim 4 further including load means connected to said first and second transistors comprising first, second and third load transistors,
   means connecting the conduction path of said first load transistor between said second electrode of said first transistor and a second point of operating potential;
   means connecting the conduction path of said second load transistor between said second electrode of said second transistor and said second point of operating potential;
   means connecting the control electrodes of said first and second load transistors to said second electrode of said first transistor;
   means connecting the conduction path of said third load transistor between said second electrodes of said first and second transistors; and
   means connecting the control electrode of said third load transistor to said second point of operating potential.

6. The combination as claimed in claim 5 wherein said first and second transistors and said third load transistors are of one conductivity type and wherein said third through sixth transistors and said first and second load transistors are of opposite conductivity type.

7. The combination as claimed in claim 6 further including: (a) a first unidirectional conducting means connected between the control electrodes of said first and second transistors poled to conduct current in one direction therebetween, and (b) a second unidirectional conducting means connected between the control electrodes of said first and second transistors poled to conduct current in the opposite direction to said one direction.

8. The combination comprising:
first and second power terminals for the application therebetween of an operating potential;
first and second input terminals for the application of differential signals therebetween;
first, second, third, and fourth transistors each transistor having first and second electrodes defining the ends of a conduction channel overlying a substrate region and having a control electrode isolated from and overlying said conduction channel;
means connecting said first and second transistors in a differential amplifier configuration including means connecting the first electrodes of said first and second transistors to a common point and means connected between said common point and said first power terminal for passing a current between said common point and said first power terminal;
means connecting one of the first and second electrodes of said third transistor to the control electrode of said first transistor and the other of said first and second electrodes of said third transistor to said first input terminal;
means connecting one of the first and second electrodes of said fourth transistor to the control electrode of said first transistor and the other of said first and second electrodes of said third transistor to said common point;
means connecting the control electrode of said third transistor to said common point;
means connecting the control electrode of said fourth transistor to said first input terminal; and
means connecting the control electrode of said second transistor to said second input terminal.

9. The combination as claimed in claim 8 wherein said first and second transistors are of one conductivity type and said third and fourth transistors are of opposite conductivity type.

10. In combination with two insulated-gate field-effect transistors (IGFETs) interconnected to form a differential amplifier, the source electrodes of the two IGFETs being connected to a common point which is returned via a conduction path to a point of reference potential, an improved circuit for limiting the maximum potential difference that an input signal can generate between the gate electrodes of the two IGFETs comprising:
first and second input terminals between which said input signal may be applied;
means connected between the gate electrode of one of the two IGFETs and said first input terminal for decoupling the input signal from the gate electrode when the input signal is of a given magnitude and of a polarity to turn-off said one IGFET;
means connected between the gate electrode of said one IGFET and said common point for clamping the gate electrode of said one IGFET to said common point when the input signal increases above said given magnitude and is of a polarity to further turn-off said one IGFET; and means coupling the gate electrode of the other IGFET to said second input terminal.

* * * * *